United States Patent [19]
Bae et al.

[11] Patent Number: 5,320,980
[45] Date of Patent: Jun. 14, 1994

[54] INTERCONNECTION STRUCTURE IN SEMICONDUCTOR DEVICE AND THE METHOD THEREOF

[75] Inventors: Dong-joo Bae, Seoul; Sung-nam Chang, Kyunggi-do, both of Rep. of Korea

[73] Assignee: Samsung Electronics Co., Ltd., Kyunggi-do, Rep. of Korea

[21] Appl. No.: 977,867

[22] Filed: Nov. 17, 1992

Related U.S. Application Data

[62] Division of Ser. No. 741,991, Aug. 8, 1991, Pat. No. 5,285,110.

[51] Int. Cl.$^5$ ............................................. H01L 21/44
[52] U.S. Cl. ..................................... 437/195; 437/21; 437/189; 437/193
[58] Field of Search ................... 437/21, 195, 189, 193

[56] References Cited

U.S. PATENT DOCUMENTS 5,084,416  1/1992  Ozaki et al. .......................... 437/195
5,144,579  9/1992  Okabe et al. .

*Primary Examiner*—Olik Chaudhuri
*Assistant Examiner*—C. Everhart
*Attorney, Agent, or Firm*—Cushman, Darby & Cushman

[57] ABSTRACT

An interconnection structure of a semiconductor device for electrically connecting a thin conductive layer and a metallization and the fabrication method thereof are disclosed. The interconnection structure includes a semiconductor substrate, an insulating layer coated on the substrate, a thick conductive layer formed on a certain portion of the insulating layer, a first interlaid insulating layer covering the thick conductive layer, a first contact hole formed within the first interlaid insulating layer on the thick conductive layer, a thin conductive layer consisting of vertical structure formed in the first contact hole and horizontal structure formed on the first interlaid insulating layer, a second interlaid insulating layer covering the thin conductive layer, a second contact hole formed within said first and second interlaid insulating layers and crossing the first contact hole, and a metallization filling the second contact hole and formed on the second interlaid insulating layer. Thus, the contact area between the metallization and thin conductive layer is increased, thereby allowing a reliable ohmic contact while directly connecting the thin conductive layer and metallization.

3 Claims, 4 Drawing Sheets

INTERCONNECTION STRUCTURE IN SEMICONDUCTOR DEVICE AND THE METHOD THEREOF

This is a division of Application No. 07/741,991, filed Aug. 8, 1991, now U.S. Pat. No. 5,285,110.

BACKGROUND OF THE INVENTION

The present invention is directed to a semiconductor device and the method thereof, and more particularly to an interconnection structure in a semiconductor device and the method thereof which allows a thin lower conductive layer and an upper conductive layer to make ohmic contact.

In the pursuit of semiconductor device miniaturization from VLSI to ULSI, many problems concerning interconnections need to be solved. They are caused by the geometrical increment of levels, the miniaturization of contact holes and via holes, limitations on the coating of conductive material, and poor connections due to the thinness of the device.

FIG. 1 shows a vertical sectional view of a conventional semiconductor device having a contact hole for connecting upper and lower conductive layers. The semiconductor device comprises an electrically insulated substrate 1 on the surface of which a thick insulating layer 2 is formed, a first conductive layer 3 deposited and patterned on the insulating layer, for instance to a thickness of about 3000 to 4000Å a thick insulating layer 4 formed on the insulating and first conductive layers, a contact hole 5 for partially exposing the first conductive layer 3, and for interconnecting a layer of metallization 6 and the first conductive layer 3, and the layer of metallization 6 formed on the partially exposed first conductive layer and the insulating layer 4.

The contact hole. 5 for interconnecting the first conductive layer 3 and the layer of metallization 6 plays the role of sending information of the first conductive layer to the layer of metallization and vice versa. The reliability of the information transfer depends not only upon the properties of the conductive layer itself but also the contact between the conductive layers.

In FIG.1 the contact hole 5 is formed by anisotropic etching, for example reactive ion etching (RIE), which simplifies highly dense integration of the circuit.

The miniaturization of integrated circuitry by the high density of the devices requires to contract not only the overall size of the device, but also selectively its width and/or thickness. For example, in a static RAM, a polysilicon layer is partially thinned to form a highresistance unit in each memory cell os, instead of the thinned highly resistant poly silicon layers, a thin PMOS transistor (TFT SRAM) is introduced.

FIG. 2 is a vertical sectional view of a semiconductor device of a general interconnection structure having a thin conductive layer and depicts the same process as FIG. 1 except that where the thickness of the first conductive layer of FIG. 1 is about 3000 to 4000Å, in FIG. 2 it is thinned to about 500Å.

Accordingly, an insulating level 4 is provided on a substrate 1 on which a thin conductive layer 7 has been formed on an insulating layer 2. Thereafter, a contact hole 5 is formed by anisotropic etching, e.g., an RIE method so that part of the thin conductive layer 7 is exposed. Then, conductive material is deposited and patterned on the surface of the insulating layer 4 and the exposed thin conductive layer, which completes the general interconnection structure including the thin conductive layer 7, the contact hole 5 and the layer of metallization 6.

When the contact hole 5 is formed by anisotropic etching, e.g., RIE, the etch selectivity of the thin conductive layer 7, e.g., an impurity-doped polysilicon layer against the insulating layer 4 to be processed is not so high (generally below 10). Therefore, when the first conductive layer 7 is formed very thin, i.e., to a thickness of about 500Å as mentioned above, if a part of the insulating layer 4 is etched one and a half times as long as the conventional one which is an allowable error or processing margin, or if the layes is etched by a much lower etch selectivity, the insulating layer 4 together with the thin conductive layer 7 and even a part of the insulating layer 2 are etched by the above mentioned etching method, thereby partially exposing the semiconductor substrate 1. If the layer of metallization 6 is formed under these conditions, the layer of metallization is directly connected to the exposed portion of the substrate 1, causing a poor interconnection Further, even if the insulating layer 2 is left intact, the whole exposed surface of the thin conductive layer and the layer of metallization to be connected are connected only to the exposed edges of the thin conductive layer 7, part of which is removed by the etching process, which substantially diminishes the contact area to worsen the resistive contact.

FIG. 3 is a vertical sectional view of a conventional interconnection structure introducing a method in which the thin conductive layer and the layer of metallization are indirectly connected via an interposing conductive material such as metal, silicide or a thick polysilicon layer.

The conventional semiconductor device comprises a semiconductor substrate 1 electrically isolated by forming a thick insulating layer 2 thereon, a third conductive layer 8 patterned on the insulating layer, a thin conductive layer 7 isolated from the third conductive layer 8 by the first interlaid insulating layer 9 and connected to the third conductive layer 8 through the first contact hole 100, and a metallization 6 which is isolated from the third conductive layer 8 by the first and second interlaid insulating layers 9 and 10 and isolated from the thin conductive layer 7 by the second interlaid isolating layer 10 only, is connected to the third conductive layer 8 through the second contact hole 200.

According to the conventional method, as thin conductive layer 7 is connected to the third conductive layer 8 through first contact hole 100 first, and the third conductive layer 8 is again connected to a metallization 6 through the second contact hole 200, information applied to the thin conductive layer 7 is transferred to the metallization 6 through the third conductive layer 8, and vice versa.

This prevents poor ohmic contacts due to reduction of connecting surface area since the thin conductive layer is connected to the metallization without directly forming the contact hole connecting the metallization layer on the thin conductive layer. However, metal, silicide or polysilicon layer used as the third conductive layer still has a problem.

When using metal or silicide, the type of contact for interconnecting the thin and third conductive layers is determined by the type of impurities-doped polysilicon used as the thin conductive layer, and a ohmic contact is available for N-type impurities. P-type impurities create the same effect as a PN junction between the thin and third conductive layers, causing a rectified contact which makes for a poor contact.

Also, when using thick polysilicon as the third conductive layer, the type of impurities doped in the thick polysilicon layer is determined according to the impurity type of impurity-doped polysilicon used as the thin conductive layer. It is desirable that the types of the two impurities are the same for a highly reliable ohmic contact.

The interconnection of the conventional semiconductor device prevents removing the thin conductive layer by overetching, but, since information is transmitted through a third conductive layer, it causes a poor contact due to the difference in the properties between the third conductive layer and the adjacent material.

SUMMARY OF THE INVENTION

Therefore, it is an object of the present invention to provide an interconnection structure of a semiconductor device in which a metallization is directly in contact with a thin conductive layer by crossing a contact structure for interconnecting the thin conductive layer and the thick conductive layer, and a contact structure for interconnecting the thin conductive layer and a metallization.

It is another object of the present invention to provide an interconnection structure of a semiconductor which supplies a satisfactory ohmic contact between the thin conductive layer and the metallization It is still another object of the present invention to provide a manufacturing method for manufacturing the semiconductor devices as described above.

To accomplish the objects, the interconnection structure of a semiconductor device for electrically connecting a thin conductive layer and a metallization, comprises a semiconductor substrate, an insulating layer coated on the substrate, a thick conductive layer formed on a certain portion of the insulating layer, a first interlaid insulating layer covering the thick conductive layer, a first contact hole formed within the first interlaid insulating layer on the thick conductive layer, a thin conductive layer consisting of vertical structure formed in the first contact hole and horizontal structure formed on the first interlaid insulating layer, a second interlaid insulating layer covering the thin conductive layer, a second contact hole formed within the first and second interlaid insulating layers and crossing the first contact hole, and a metallization filling the second contact hole and formed on the second interlaid insulating layer, whereby contact area between the metallization and thin conductive layers is increased.

To accomplish the objects of the present invention, there is provided a method for manufacturing an interconnection structure for electrically connecting a thin conductive layer and the metallization in a semiconductor device which comprises the steps of forming a thick conductive layer directly under the area where a contact hole for connecting the thin conductive layer and metallization will be formed, forming a first interlaid insulating layer on the entire surface of the thick conductive layer, forming a first contact hole on the first interlaid insulating layer, forming a thin conductive layer on the first interlaid insulating layer in which the first contact hole has been formed, patterning the thin conductive layer, forming a second interlaid insulating layer on the entire surface of the patterned thin conductive layer, forming a second contact hole, crossing the first contact hole in the second and first interlaid insulating layers, depositing conductive material on the second interlaid insulating layer in which the second contact hole has been formed, and forming a metallization by patterning the conductive material.

BRIEF DESCRIPTION OF THE DRAWINGS

The above objects and other advantages of the present invention will become more apparent by describing in detail a preferred embodiment of the present invention with reference to the attached drawings in which.

DETAILED DESCRIPTION OF THE INVENTION

Figure 1:
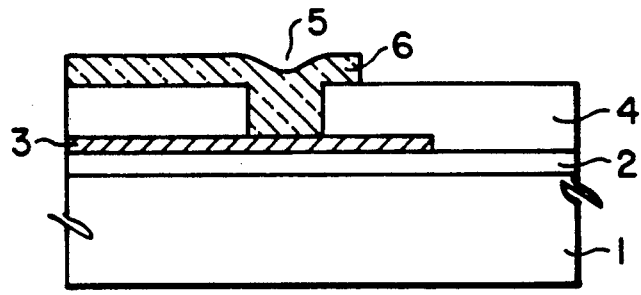
FIG. 1 is a vertical section of a semiconductor device having a general interconnection structure.
Figure 2:
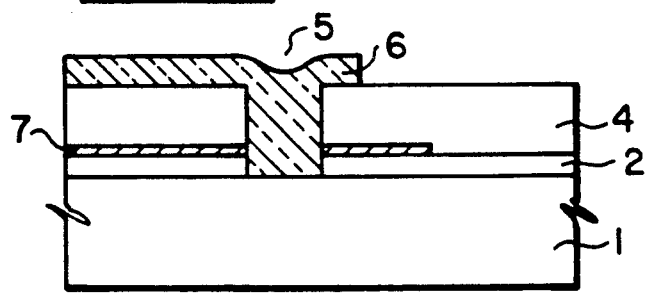
FIG. 2 is a vertical section of a semiconductor device having a general interconnection structure with thin lower conductive layers.
Figure 3:
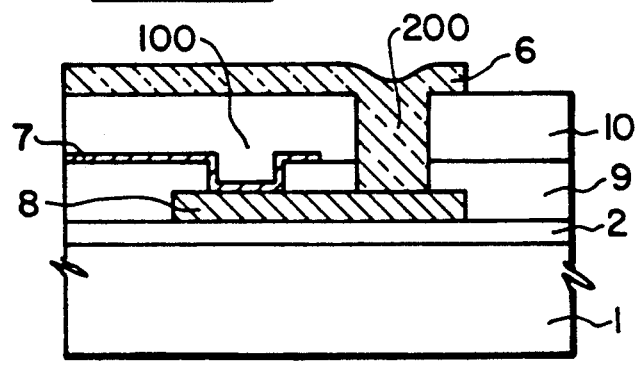
FIG. 3 is a vertical section of a conventional semiconductor device improving the general interconnection structure.
Figure 4:
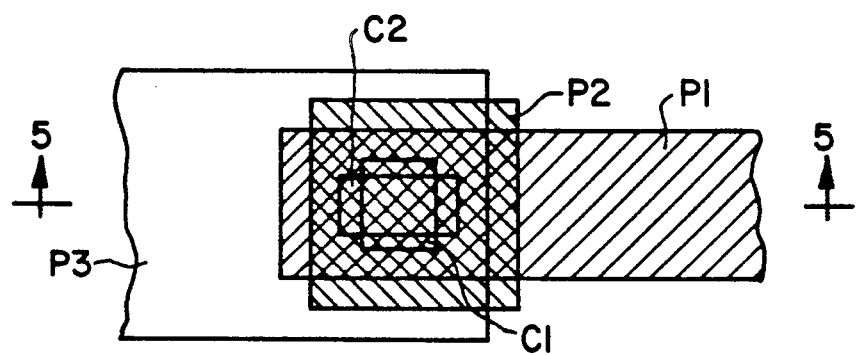
FIG. 4 is a plan view for an interconnection of the present invention and the method thereof.

FIG. 4 is a plan illustrating an interconnection structure and the method thereof according to the present invention.

Referring to FIG.4, a square portion with sparsely oblique lines therein is a mask pattern P2 for forming a thick conductive layer, a rectangular portion formed within the mask pattern P2 and long in the vertical direction is a mask pattern C1 for forming a first contact hole for connecting the thick and thin conductive layers, a portion long in the horizontal direction with densely oblique lines therein is a mask pattern P1 for forming the thin conductive layer, a portion crossing the mask pattern C1 and long in the horizontal direction is a mask pattern C2 for forming a second contact hole for connecting the thin conductive layer and a metallization, and a portion long in the horizontal direction with no internal lines is a mask pattern P3 for forming the metallization.

Figure 5:
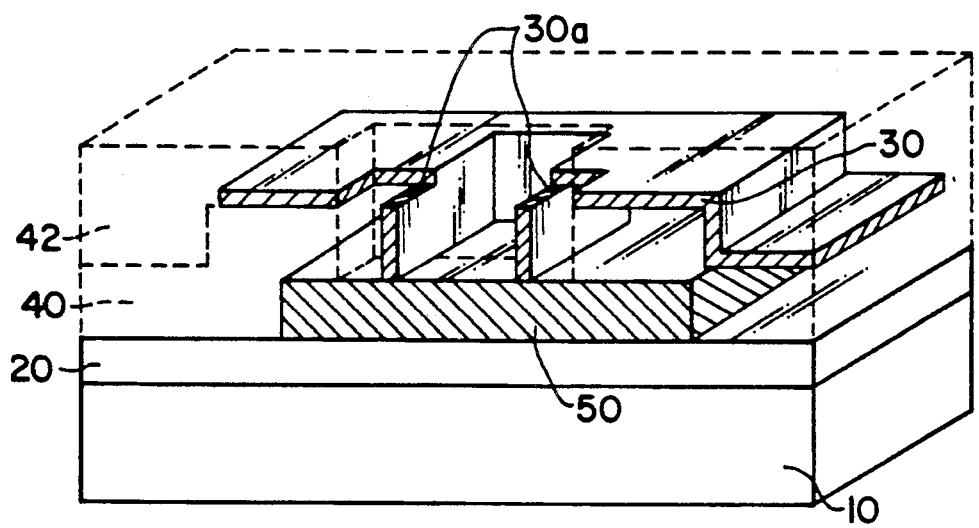
FIG. 5 is a partially cutaway perspective view of the interconnection structure of a semiconductor device of the present invention which cuts through the semiconductor device along line AA' of FIG. 4.

FIG. 5 is a perspective view of the interconnection of a semiconductor device of the present invention which cuts through the semiconductor device along AA' of FIG.4.

Referring to FIG. 5, the interconnection structure of a semiconductor device of the present invention includes a semiconductor substrate 10 electrically isolated by forming a thick insulating layer 20 thereon, a thick conductive layes 50 patterned on the insulating layer 20, a first interlaid insulating layer 40 formed on the entire thick insulating layer and partially removed on the thick conductive layer, a thin conductive layer 30 which includes a portion 30a formed in the shape of vertical wall within the void where the first interlaid insulating layer is partially removed, and patterned on top of the remaining portion of the first interlaid insulating layer, and a second interlaid insulating layer 42 formed on the patterned thin conductive layer 30 and the remaining first interlaid insulating layer, whereby the thin conductive layer 30a in the form of vertical wall allows a larger connection area thereby enabling a reliable ohmic contact.

More details on the interconnecting method of a semiconductor device of the present invention follow with reference to FIG. 6A to 6D.

Figure 6A:
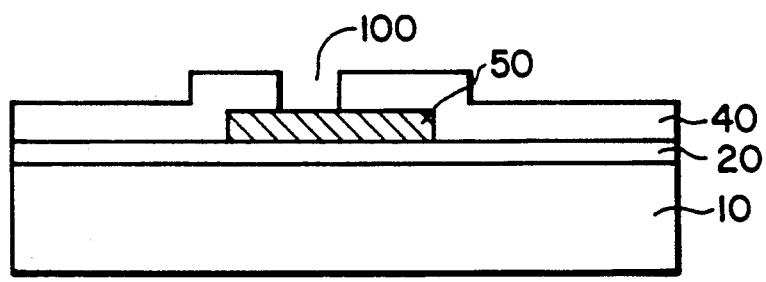
FIGS. 6A to 6D are vertical sections for illustrating an interconnecting method of a semiconductor device according to the present invention.

FIG. 6A illustrates the process of forming a first contact hole on the first interlaid insulating layer 40. Referring to FIG. 6A, semiconductor substrate 10 is electrically isolated by forming a thick insulating layer 20 on the entire surface of the substrate 10, and a thick conductive layer is coated on the insulating layer with material such as polysilicon. The polysilicon layer may be formed by a special process to form the interconnection, but in many cases the layer is formed by an extended part of some thick polysilicon layer made during formation of the semiconductor device.

For instance, in a full CMOS static RAM, normal circuit structure using a MOS transistor requires many gate electrodes formed above and below an interlaid insulating layer, so the thick polysilicon layer may be readily provided. In either case, extended from the surrounding circuit of formed by an additional process, the type of impurities doped in the polysilicon does not matter since the thick conductive layer does not act as a medium for transmitting information as does the prior art. Also, when forming the polysilicon layer by an additional process, impurities are not doped.

Sequentially, the polysilicon layer is patterned using the mask pattern P2 to form a thick conductive layer 50, and a thick insulating material is coated on the entire thick conductive layer and the insulating layer to form a first interlaid insulating layer 40.

First contact hole 100 is formed in the first interlaid insulating layer 40 using the mask pattern C1 by anisotropic etching such as RIE, at this time thick conductive layer 50 functions as etch stop layer in the etching process.

Figure 6B:
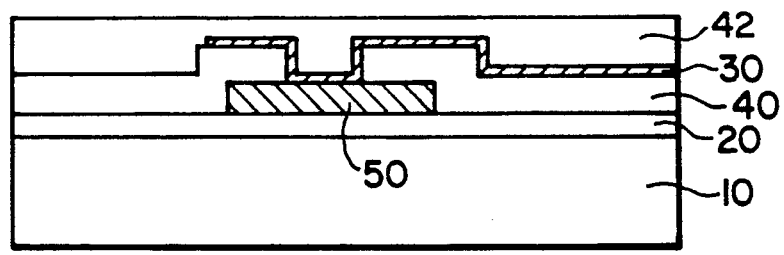

FIG. 6B illustrates the process of forming a thin conductive layer 30 and a second interlaid insulating layer 42. Referring to FIG. 6B, a thin conductive layer such as impurity doped polysilicon is coated to a thickness of about 500A on the entire surface of the substrate on which first contact hole 100 has been formed, and patterned using the mask pattern P1 to form the thin conductive layer 30.

Then, second interlaid insulating layer 42 is completed by coating insulating material and planarizing the surface thereof. As the insulating material, anything with an isolating effect is allowable, but it is noted that it must have the same or similar etch selectivity as/to the insulating material of the first interlaid insulating layer 40.

Figure 6C:
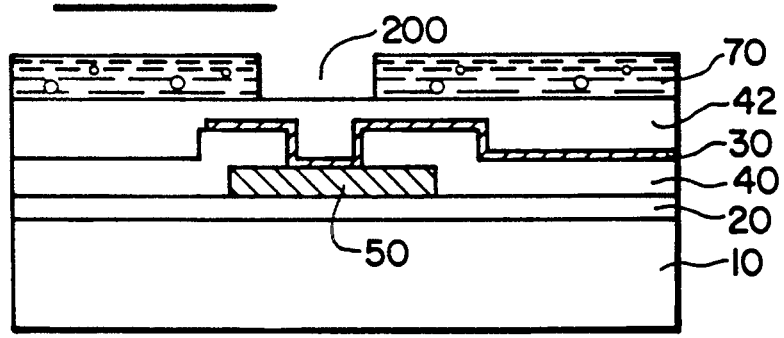

FIG. 6C illustrates the process of foaming a second contact hole 200. Referring to FIG.6C, a photosensitive layer is coated on the entire surface of the second interlaid insulating layer 42, and patterned by the mask pattern C2 to form a photosensitive layer pattern 70. Then, a second contact hole is formed on the second interlaid insulating layer 42 by exposing the substrate on which the photosensitive layer pattern 70 has been formed to gas fox anisotropic etching. The anisotropic etching process is the same as the process of forming the first contact hole, and the second contact hole 200 formed by the mask pattern C2, crosses the first contact hole 100 formed by the mask pattern C1

More details on experimental facts occurring during the process of anisotropic etching for forming the second contact hole follow. The material to be removed by the etching process should be confined to the second interlaid insulating layer 42. However, when the thin conductive layer is very thin, that is, about 500A as described above in detail, if a part of the second interlaid insulating layer 42 is etched one and a half times the normal etching duration which is an allowable error of process margin, os if the etch selectivity between the thin conductive layer and the second interlaid insulating layer lessens, the thin but the thin conductive layer 30 not only the second interlaid insulating layer 42 are etched together and, simultaneously, a part of the first interlaid insulating layer 40 is also etched so that the thick conductive layer is partially exposed. The thick conductive layer 50 functions as etch stop for stopping the etching process, and part of the thin conductive layes formed on the inner side wall of the first contact hole remains unetched because although horizontally disposed portion of the thin conductive layer is very thin to be etched away, the vertically disposed portion on the inner side wall of the first contact hole is not etched due to the isotropic etch, thereby leaving a portion in the shape of vertical walls.

The thin conductive layer 30a in the shape of vertical wall offsets a connection area equal to both sides and the top of each of the metal contacts, thereby allowing reliable resistive contact.

Figure 6D:
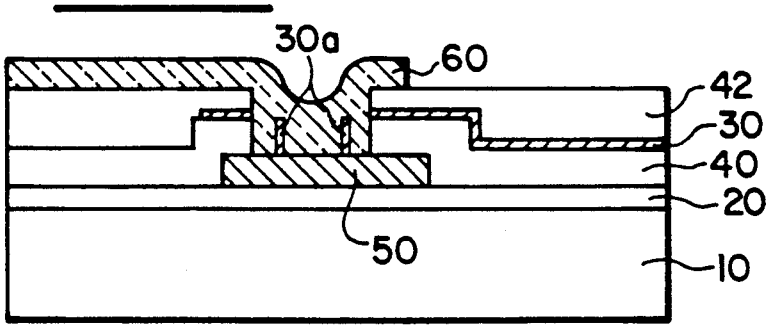

FIG. 6D illustrates the process of forming a metallization 60. A conductive material is deposited on the entire surface of the substrate which is constructed such that the first and second contact holes cross each other, and is patterned by the mask pattern P3, completing the metallization 60.

Therefore, the interconnection structure of a semiconductor device is accomplished by the fact that the first and second contact holes cross each other, the thick conductive layer is formed under the crossed structure of the contact holes, and the thick conductive layer 50, thin conductive layer 30 and metallization 60 are contact with one another through the crossed structure.

Figure 7:
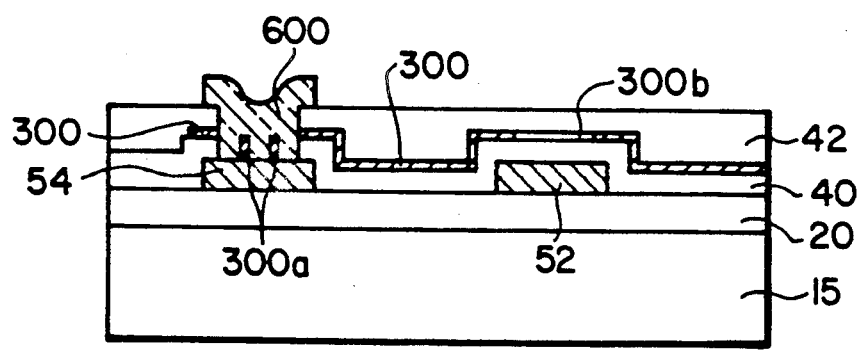
FIG. 7 is a vertical section showing an embodiment of the interconnecting method according to the present invention.

FIG. 7 is a vertical section of a semiconductor device employing the interconnection structure according to the present invention.

In a static RAM a high resistance element formed with polysilicon is used as loads of each memory cell, however, since a resistance element of 10TQ for manufacturing a reliable megabit SRAM while maintaining the standby current at a certain level measured in microamperes, has many difficulties in fabrication, considering the activation energy of the polysilicon resistance element and the element's low voltage operation, a method of using a thin polysilicon PMOS as the load has been proposed.

The PMOS thin transistor (TFT: Thin Film Transistor) static RAM is a new SRAM cell manufactured in such a manner that a NMOS device consisting of the SRAM cell is formed on a semiconductor substrate, an insulating layer is coated thereon, and a PMOS transistor made of a thin polysilicon is formed on the insulating layer.

In the new SRAM, the PMOS transistor is used as a load and its electrical properties vary depending on the thickness of the polysilicon forming the PMOS. It is obvious from many reports that the thinner the polysilicon is, the more its electrical properties improve.

The semiconductor device shown in FIG. 7 includes an insulating layer 20 formed on substrate 15 on which NMOS transistor is formed, for electrical isolation, and a thin transistor and a metallization 600 formed on the insulating layer. The thin transistor consists of gate electrode 52, channel region 300b and P-type impurity diffusion region 300. One side of the P-type impurity diffusion region 300 is connected to the metallization 600, and a thick polysilicon layer 54 extending another gate electrode is formed under the portion for connecting the P type impurity diffusion region 300 and the metallization 600. The interconnection of the present invention is applied for connecting the impurity diffusion region 300 and the metallization 600.

Accordingly, the interconnection structure and interconnecting method of the present invention may be applied to any semiconductor device wherein a thick conductive layer is formed under a thin conductive layer and the two conductive layers are connected to each other, and which enables a reliable ohmic contact even if the thin conductive layer and metallization are directly connected.

While the invention has been particularly shown and described with reference to preferred embodiments thereof, it will be understood by those skilled in the art that various changes in form and details may be made therein without departing from the spirit and scope of the invention as defined by the appended claims.

What is claimed is:

1. A method for manufacturing an interconnection structure of a semiconductor device for electrically connecting a conductive layer and a metallization comprising the steps of:

forming a first conductive layer directly under the area where a contact hole for connecting said first conductive layer and metallization will be formed;

forming a first interlaid insulating layer on the entire surface of said first conductive layer;

forming a first contact hole in said first interlaid insulating layer using a first mask pattern;

forming a second conductive layer on said first interlaid insulating layer in which said first contact hole has been formed and on inner sidewall of said first contact hole;

patterning said second conductive layer;

forming a second interlaid insulating layer on the entire surface of patterned said second conductive layer;

forming a second contact hole crossing the first contact hole in said second and first interlaid insulating layers using a second mask pattern crossing said first mask pattern, to thereby leave a portion of said second conductive layer in the shape of a vertical wall;

depositing conductive material on said second interlaid insulating layer in which said second contact hole has been formed; and forming said metallization by patterning the conductive material, to thereby increase contact area between said second conductive layer and said metallization.

2. A method for manufacturing an interconnection structure of a semiconductor device as claimed in claim 1, wherein said first conductive layer is larger than the area where said first and second contact holes cross each other.

3. A method for manufacturing an interconnecting structure of a semiconductor device as claimed in claim 1, wherein said first and second interlaid insulating layers are made of insulating materials having the same etch selectivities.

* * * * *